US 6,961,624 B2

(12) United States Patent
Kirkpatrick et al.

(10) Patent No.: US 6,961,624 B2
(45) Date of Patent: Nov. 1, 2005

(54) TWO-WIRE FIELD-MOUNTED PROCESS DEVICE

(75) Inventors: William R. Kirkpatrick, Faribault, MN (US); Robert J. Karschnia, Chaska, MN (US); Marcos Peluso, Chanhassen, MN (US); Steven J. DiMarco, Chanhassen, MN (US); Gary A. Lenz, Eden Prairie, MN (US)

(73) Assignee: Rosemount Inc., Eden Prairie, MN (US)

( * ) Notice: Subject to any disclaimer, the term of this patent is extended or adjusted under 35 U.S.C. 154(b) by 84 days.

(21) Appl. No.: 10/760,793

(22) Filed: Jan. 20, 2004

(65) Prior Publication Data

US 2004/0158334 A1 Aug. 12, 2004

Related U.S. Application Data

(63) Continuation of application No. 10/400,148, filed on Mar. 26, 2003, now Pat. No. 6,711,446, which is a continuation of application No. 09/570,268, filed on May 12, 2000, now Pat. No. 6,574,515.

(51) Int. Cl.$^7$ .............................................. G05B 11/01
(52) U.S. Cl. ............................... 700/19; 700/2; 700/9; 700/11; 700/37; 700/79; 710/11; 710/12; 710/16; 710/105; 714/6; 714/11; 370/410; 370/437; 370/468; 370/493
(58) Field of Search ............................ 700/1–3, 27–30, 700/9, 11, 17, 37, 83, 79; 710/11, 12, 16, 105, 38; 714/6, 11; 370/410, 437, 493, 468

(56) References Cited

U.S. PATENT DOCUMENTS 4,122,719 A 10/1978 Carlson et al. ............... 72/342

4,243,931 A 1/1981 dela Cruz .................. 323/302

(Continued)

FOREIGN PATENT DOCUMENTS

| DE | 297 20 492 U1 | 2/1998 |
|---|---|---|
| EP | 0 601 344 A1 | 6/1994 |
| EP | 0 666 631 A2 | 1/1995 |
| GB | 2 329 039 | 3/1999 |
| JP | 52-108194 | 9/1977 |
| JP | 07162345 A | 6/1995 |

OTHER PUBLICATIONS

"Model 848T Eight Input Temperature Transmitter With FOUNDATION™ Fieldbus", *Product Data Sheet 00813–0100–4697*, Mar. 2003.
D5000 Series Users Manual, 23 pages, Revised Jan. 1, 1998.
"ACE pc," Arcom Control Systems, 1 page dated Feb. 23, 2000, downloaded from http://www.arcom.co.uk/products/iep/systems/ace/default.htm.

(Continued)

*Primary Examiner*—Ramesh Patel
(74) *Attorney, Agent, or Firm*—Westman, Champlin & Kelly, P.A.

(57) ABSTRACT

A two-wire field-mounted process device with multiple isolated channels includes a channel that can be an input channel or an output channel. The given input or output channel can couple to multiple sensors or actuators, respectively. The process device is wholly powered by the two-wire process control loop. The process device includes a controller adapted to measure one or more characteristics of sensors coupled to an input channel and to control actuators coupled to an output channel. The controller can be further adapted to execute a user generated control algorithm relating process input information with process output commands. The process device also includes a loop communicator that is adapted to communicate over the two-wire loop.

40 Claims, 4 Drawing Sheets

U.S. PATENT DOCUMENTS

| | | | | |
|---|---|---|---|---|
| 4,413,314 | A | | 11/1983 | Slater et al. .................. 341/20 |
| 4,678,937 | A | | 7/1987 | Price .......................... 307/311 |
| 4,910,658 | A | | 3/1990 | Dudash et al. ............. 340/3.54 |
| 4,936,690 | A | | 6/1990 | Goetzinger ................ 374/181 |
| 5,307,346 | A | | 4/1994 | Fieldhouse ................. 370/254 |
| 5,495,769 | A | | 3/1996 | Broden et al. ................ 73/718 |
| 5,551,053 | A | | 8/1996 | Nadolski et al. ............ 395/829 |
| 5,706,007 | A | | 1/1998 | Fragnito et al. ............ 341/155 |
| 5,713,668 | A | | 2/1998 | Lunghofer et al. ......... 374/179 |
| 5,737,543 | A | | 4/1998 | Gavin et al. ................ 710/105 |
| 5,825,664 | A | | 10/1998 | Warrior et al. ............. 364/550 |
| 5,876,122 | A | | 3/1999 | Eryurek ..................... 374/183 |
| 5,960,214 | A | * | 9/1999 | Sharpe et al. ................ 710/15 |
| 5,980,078 | A | | 11/1999 | Krivoshein et al. ............ 700/1 |
| 6,014,612 | A | * | 1/2000 | Larson et al. .............. 702/183 |
| 6,016,523 | A | | 1/2000 | Zimmerman et al. ......... 710/63 |
| 6,026,352 | A | * | 2/2000 | Burns et al. ................ 702/182 |
| 6,035,240 | A | | 3/2000 | Moorehead et al. ........... 700/2 |
| 6,047,222 | A | | 4/2000 | Burns et al. .................. 700/79 |
| 6,052,655 | A | | 4/2000 | Kobayashi et al. ......... 702/184 |
| 6,088,665 | A | * | 7/2000 | Burns et al. ................ 702/188 |
| 6,094,600 | A | * | 7/2000 | Sharpe et al. ................ 700/19 |
| 6,104,875 | A | | 8/2000 | Gallagher et al. .......... 717/166 |
| 6,192,281 | B1 | * | 2/2001 | Brown et al. ................... 700/2 |
| 6,574,515 | B1 | * | 6/2003 | Kirkpatrick et al. .......... 700/19 |
| 6,711,446 | B2 | * | 3/2004 | Kirkpatrick et al. .......... 700/19 |
| 2002/0010518 | A1 | | 1/2002 | Reid et al. |

OTHER PUBLICATIONS

"Smart Transmitter (HART Protocol) Interface Products," 1770 Communication Products, 2 pages dated Apr. 26, 1999, downloaded from http://www.ab.com/catalogs/html/b112/io/smart.html.

Office Action from the Chinese Patent Office in related Chinese application.

"Advanced Systems Simplify Control," Machine Design, Penton, Inc., vol. 68, Nr. 12, pp. 118, 120 (Jul. 11, 1996).

Babb, M., "Looking Around for More Work To Do," Control Engineering International, vol. 43, Nr. 14, pp. 59–60, 62 (Oct. 1996).

"Transducer Intrerfacing Handbook," A Guide to Analog Signal Conditioning, by Daniel H. Sheingold, 5 pages (1980).

"Smart Head and Rail Mount Temperatures Transmitters," Models 644H and 644r, FISCHER–ROSEMOUNT Managing the Process Better, pp. 37–52 (1998).

"Smart Temperature Transmitter," Models 3144 and 3244MV, FISHER–ROSEMOUNT Managing the Process Better, pp. 19–36 (1998).

Observations by Third Party filed in related European Application including Translation.

Instruction Manual FD0–BI–Ex12.PA, German language document, and apparent English equivalent Part No.: 107591, Jan. 24, 2001.

Universal temperature multiplexer for Foundation Fieldbus, Universal converter, analogue, F2D0–TI–Ex8.FF, 2003.

Valve Coupler for Foundation Fieldbus, Manual FD0–VC–Ex4.FF, Nov. 22, 2000.

PROFIBUS–PA Valve Coupler Filed Box, 2002 IS Catalog, 2002.

PROFIBUS–PA Sensor Interface Field Box, 2002 IS Catalog, 2002.

EC–Type Examination Certificate for FD0–VC–Ex4.Pa dated Dec. 18, 1998 (German Language document and apparent English translation).

Supplement to EC–Type Examination Certificate for FD0–VC–Ex.Pa dated Sep. 18, 2000 (German Language document and apparent English translation).

Supplement to EC–Type Examination Certificate for FD0–VC–Ex4.Pa dated Sep. 21, 2000 (German Language document and apparent English translation).

$1^{st}$ Amendment to EC–Type Examination Certificate for FD0–VC–Ex4.Pa dated Dec. 22, 1999 (German Language document and apparent English translation).

\* cited by examiner

TWO-WIRE FIELD-MOUNTED PROCESS DEVICE

The present application is a continuation of and claims priority of U.S. patent application Ser. No. 10/400,148, filed Mar. 26, 2003, now U.S. Pat. No. 6,711,446, which is a continuation of and claims priority to U.S. patent application Ser. No. 09/570,268, filed May 12, 2000, now U.S. Pat. No. 6,574,515, the content of which is hereby incorporated by reference in its entirety.

BACKGROUND OF THE INVENTION

The present invention relates to process devices. More specifically, the present invention relates to field-mounted process control and measurement devices.

Process devices are used to measure and control industrial processes such as the refining of petrochemicals, the processing of food, the generation of electric power, and a number of other processes. Process measurement devices include process variable transmitters, which measure a process variable such as pressure or temperature and communicate the measured variable to a process controller. Another type of process device is an actuator, such as a valve controller or the like. Generally, process control is accomplished using a combination of transmitters, actuators, and a process controller that communicate across a process control loop to a controller. Both types of process devices interact with the physical process through process interface elements. Process interface elements are devices which relate electrical signals to physical process conditions, and include devices such as sensors, limit switches, valve controllers, heaters, motor controllers, and a number of other devices.

The process controller is typically a microcomputer located in a control room away from the process. The process controller can receive process information from one or more process measurement devices and apply a suitable control signal to one or more process control devices to influence the process and thereby control it.

In order to couple to the process, transmitters and actuators are generally mounted near the process in the field. Such physical proximity can subject the process devices to an array of environmental challenges. For example, process devices are often subjected to temperature extremes, vibration, corrosive and/or flammable environments, and electrical noise. In order to withstand such conditions, process devices are designed specifically for "field-mounting." Such field-mounted devices utilize robust enclosures, which can be designed to be explosion-proof. Further, field-mounted process devices can also be designed with circuitry that is said to be "intrinsically safe", which means that even under fault conditions, the circuitry will generally not contain enough electrical energy to generate a spark or a surface temperature that can cause an explosion in the presence of an hazardous atmosphere. Further still, electrical isolation techniques are usually employed to reduce the effects of electrical noise. These are just a few examples of design considerations, which distinguish field-mounted process devices from other devices, which measure sensor characteristics and provide data indicative of such characteristics.

Aside from the environmental considerations listed above, another challenge for field-mounted devices is that of wiring. Since process devices are located near the process far from the control room, long wire runs are often required to couple such devices to the control room. These long runs are costly to install and difficult to maintain.

One way to reduce the requisite wiring is by using two-wire process devices. These devices couple to the control room using a two-wire process control loop. Two-wire devices receive power from the process control loop, and communicate over the process control loop in a manner that is generally unaffected by the provision of power to the process device. Techniques for communicating over two-wires include 4–20 mA signaling, the Highway Addressable Remote Transducer (HART®) Protocol, FOUNDATION™ Fieldbus, Profibus-PA and others. Although two-wire process control systems provide wiring simplification, such systems provide a limited amount of electrical power to connected devices. For example, a device that communicates in accordance with 4–20 mA signaling must draw no more than 4 mA otherwise the device's current consumption would affect the process variable. The frugal power budget of two-wire process devices has traditionally limited the functionality that could be provided.

Another way the process control industry has reduced field wiring is by providing transmitters with two sensor inputs. Such transmitters reduce the number of transmitters/sensor and thereby reduce wiring costs as well as overall system costs. One example of such a transmitter is the Model 3244MV Multivariable Temperature Transmitter, available from Rosemount Inc., of Eden Prairie, Minn.

Although current multivariable transmitters can reduce wiring costs as well as overall system costs, they have traditionally been limited to applications involving two sensors. Thus, in applications with sixteen sensors, for example, eight multivariable transmitters would still be required. Further, if different sensor groups are independently grounded, there is a possibility that ground loop errors could occur and adversely affect process measurement.

Current methods used to overcome the problem of coupling a large number of sensors to the control room include coupling the sensors directly to the control room. For example, if a situation requires a large number of temperature sensors, consumers generally create "direct run" thermocouple configurations where thermocouple wire spans the distance between the measurement "point" and the control room. These direct run configurations are generally less expensive than the cost of obtaining a number of single or dual sensor transmitters, however, a significant wiring effort is required, and process measurement is rendered more susceptible to electrical noise due to the long runs.

The process control industry has also reduced the effects of long wire runs on process control by providing field-mounted devices that are capable of performing control functions. Thus, some aspects of process control are transferred into the field, thereby providing quicker response time, less reliance upon the main process controller, and greater flexibility. Further information regarding such control functions in a field-mounted device can be found in U.S. Pat. No. 5,825,664 to Warrior et al, entitled FIELD-MOUNTED CONTROL UNIT, assigned to Rosemount Incorporated.

Although multivariable transmitters and process devices implementing control functions have advanced the art of process control, there is still a need to accommodate applications requiring a relatively large number of sensors, as well as applications requiring enhanced control in the field.

SUMMARY

A two-wire field-mounted process device is provided. In one embodiment, the process device includes multiple isolated channels includes a channel that can be an input channel or an output channel. The given input or output channel can couple to multiple sensors or actuators, respectively. The process device is wholly powered by the two-wire process control loop. The process device includes a controller adapted to measure one or more characteristics of sensors coupled to an input channel and to control actuators coupled to an output channel. The process device also includes a loop communicator that is adapted to communicate over the two-wire loop. In another embodiment, the two-wire field-mounted process device includes a controller that is adapted to execute a user generated control algorithm relating process input information with process output commands. The process device of this embodiment also includes a loop communicator that is adapted to communicate over the two-wire loop.

DETAILED DESCRIPTION OF THE PREFERRED EMBODIMENTS

Figure 1:
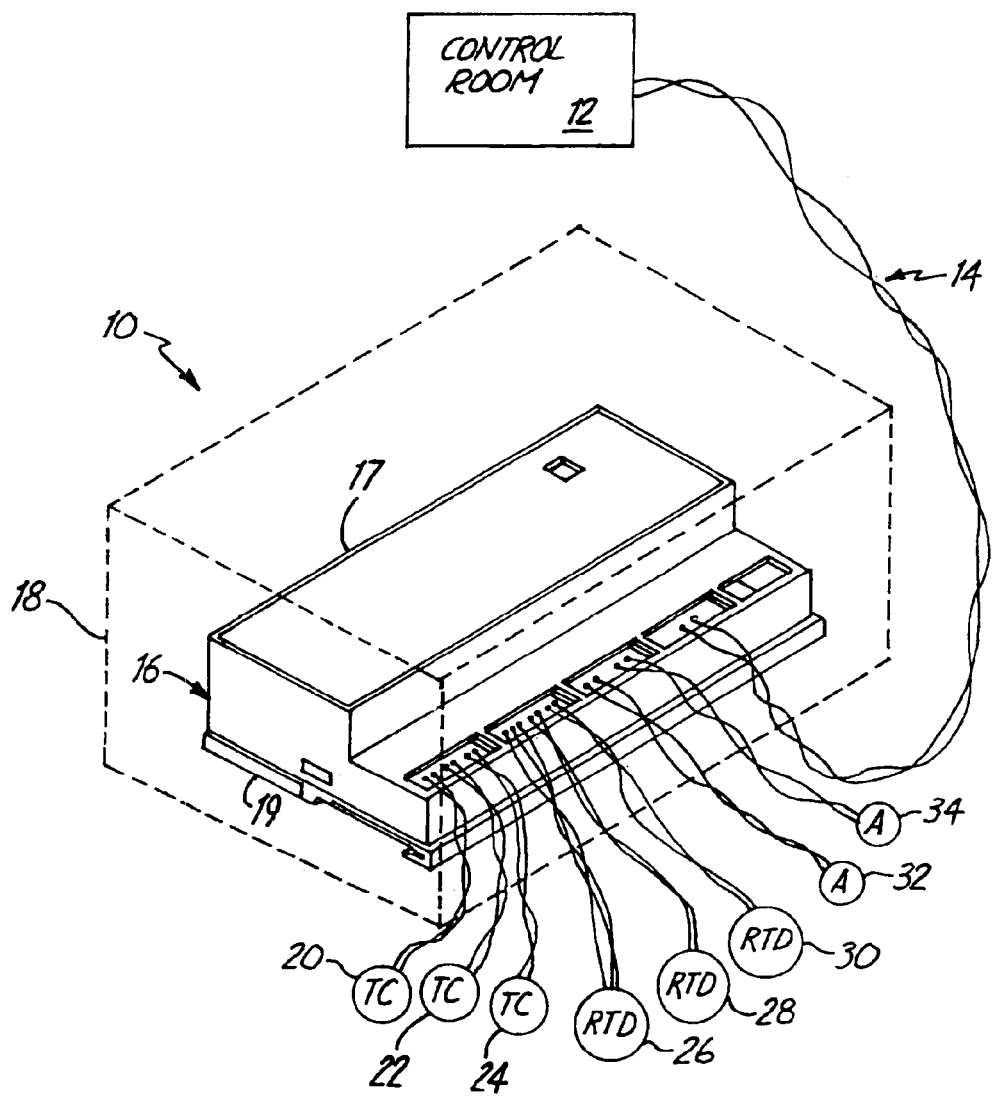
FIG. 1 is a diagrammatic view of a process control system employing a two-wire field mounted process device in accordance with an embodiment of the present invention.

A two-wire field mountable process device 16 shown in FIG. 1 is provided which can be adapted to execute sophisticated user generated control algorithms, much like those used with traditional programmable logic controllers. Embodiments can include input channels, output channels, and any combination of the two. Generally, each channel is isolated from the remainder of the process device. Such isolation removes ground loop errors that currently limit multiple input transmitters. Finally, power management is such that embodiments of the present invention are wholly powered by a two-wire process loop 14. These and other features will become apparent upon review of the figures and the related description provided below.

FIG. 1 is a diagrammatic view of process control system 10 which includes control room 12, process control loop 14 and process device 16. Process control system can comprise a single process device coupled to control room 12, however system 10 can also include hundreds of process devices coupled to one or more control rooms over a number of process control loops.

Control room 12 is typically a facility located away from device 16 that includes a microcomputer. A user stationed in control room 12 uses the microcomputer to interact with various process devices through process control loop 14 and thus controls the process(es) from the control room. For clarity, control room 12 is illustrated as a single block. However, in some control system embodiments, control room 12 may in fact couple process control loop 14 to a global computer network, such as the internet, so that users worldwide could access process device 16 from traditional web browser software.

Loop 14 is a two-wire process control loop. A number of two-wire process communication protocols exist for communicating on loop 14, and any suitable protocol can be used. For example, the HART® protocol, the FOUNDATION™ Fieldbus protocol, and the Profibus-PA protocol can be used with embodiments of the present invention. Loop 14 provides power to connected process devices while providing communication between the various devices.

Process device 16 includes cover 17 and base 19 which are preferably constructed from a suitable plastic material. Base 19 is adapted to mate with an industry standard DIN rail for mounting. As will be described in more detail, device 16 is adapted to operate solely upon electrical power received through loop 14, and is adapted for field-mounting. Thus, device 16 is configured to withstand a relatively large temperature range (such as −40 to 85 deg. C.), mechanical vibrations, and relative humidity in excess of 90%. Such environmental resistance is effected primarily through the selection of robust components, as will be described later in the specification. Optional enclosure 18 (shown in phantom) provides added durability and can be any known enclosure such as a National Electrical Manufacturers Association (NEMA) enclosure, or an explosion-proof enclosure. The process device embodiment shown in FIG. 1 has a number of inputs and outputs, and includes suitable computing circuitry (shown in FIG. 2) to execute a user generated control algorithm. The algorithm is comprised of a number of logic statements relating specific input events to outputs controlled by device 16. The user can change the algorithm either by interfacing locally with device 16, or by communicating with device 16 over control loop 14. The algorithm can be generated using conventional logic generation software such as Relay Ladder Logic and Sequential Function Charts (SFC's). In this sense, device 16 can be considered a two-wire field-mountable programmable logic controller. Although the description will focus upon the embodiment shown in FIGS. 1 and 2, such description is provided for clarity, since embodiments employing solely inputs, or outputs are expressly contemplated. Traditionally devices with the computational power of device 16 could not be operated upon two-wire process control loops due to prohibitive power constraints.

Process device 16 is coupled to sensors 20, 22, 24, 26, 28 and 30 as well as actuators 32 and 34. Sensors 20, 22 and 24 are thermocouples, of known type, which are coupled to various process points to provide voltage signals based upon process variables at the respective process points. Resistance Temperature Devices (RTD's) 26, 28 and 30 are also coupled to various process points and provide a resistance that is based upon process temperature at the respective process points. RTD 26 is coupled to device 16 through a known three-wire connection and illustrates that various wiring configurations can be used with embodiments of the present invention. Actuators 32 and 34 are coupled to process device 16 and actuate suitable valves, switches and the like based upon control signals from device 16. As noted above, device 16 can execute a user generated control algorithm to relate specific input conditions to specific output commands. For example, device 16 may sense a process fluid temperature, and cause actuator 32 to engage a heater coupled to the process fluid in order to maintain the fluid temperature at a selected level.

Figure 2:
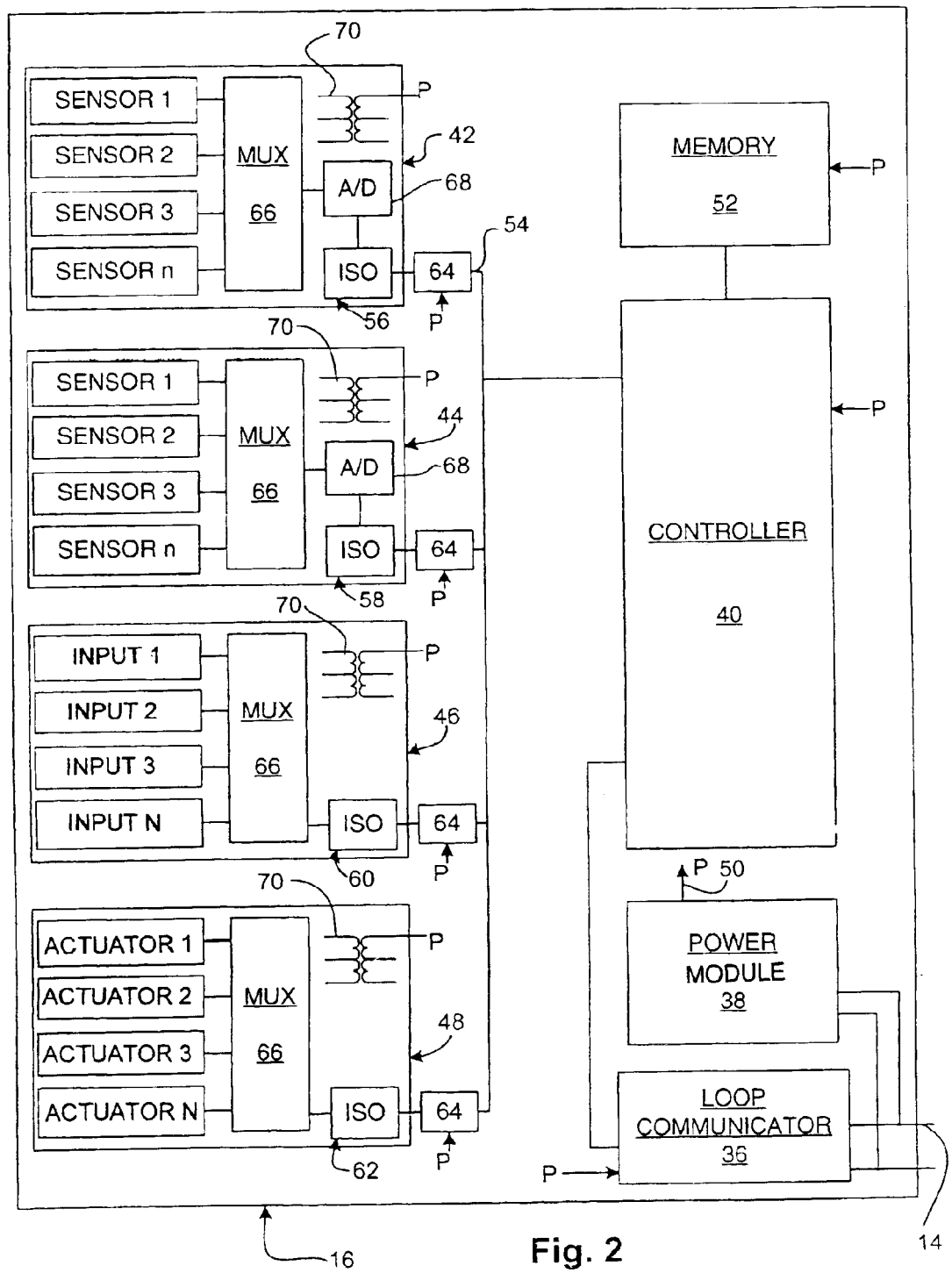
FIG. 2 is a system block diagram of the process device shown in FIG. 1.

FIG. 2 is a system block diagram of device 16 shown in FIG. 1. Device 16 includes loop communicator 36, power module 38, controller 40, and channels 42, 44, 46, 48, and memory 52. Loop communicator 36 is coupled to process control loop 14 and is adapted for bi-directional data communication over loop 14. Loop communicator 36 can include a known communication device such as a traditional FOUNDATION™ Fieldbus communication controller or the like. Additionally, communicator 36 can include suitable isolation circuitry to facilitate compliance with the intrinsic safety specification as set forth in the Factory Mutual Approval Standard entitled "Intrinsically Safe Apparatus and Associated Apparatus for Use in Class I, II, and III, Division 1 Hazardous (Classified) Locations," Class Number 3610, published October 1988.

Power module 38 is coupled to loop 14 such that power module 38 provides power to all components of device 16 based upon power received from loop 14. Although power module 38 has a single arrow 50 indicating that power module 38 provides power to all components, it is noted that such power can be provided at multiple voltages. For example, power module 38 preferably includes a switching power supply that provides electrical power at a plurality of voltages. Thus, some components such as the A/D converters and the isolators can receive a higher voltage such as 4.9 volts, while low-power components such the controller 40, memory 52 and loop communicator 36 receive a lower voltage such as 3.0 volts. Additionally, power module 38 is preferably programmable to such an extent that at least one of the voltages provided can be varied. The selectable nature of power module 38 facilitates power management, which will be described later in the specification.

Controller 40 is coupled to memory 52 and executes program instructions stored therein. Memory 52 is preferably low-power memory operating on 3.0 volts, such as the model LRS1331, available from Sharp Electronics. Additionally, memory 52 can be "stacked" memory in which both flash memory and volatile memory are provided on a single memory module. The user generated control algorithm, or "program" executed by controller 40 can be changed by a user either by coupling to device 16 locally, or by accessing device 16 through loop 14. In some embodiments the program includes instructions that relate process event inputs to outputs determined by controller 40. In this sense, device 16 functions similarly to a programmable logic controller, which is a device that typically has not been robust enough for field-mounting, nor able to operate on the low power levels of two-wire field devices. However, by so providing the functions of a programmable logic controller, much more sophisticated process control algorithms can be implemented through a user friendly interface, such as Relay Ladder Logic or the like.

Controller 40 receives power from module 38, and communicates with loop communicator 36. Controller 40 preferably includes a low-power microprocessor such as the model MMC 2075 microprocessor available from Motorola Inc. of Schaumburg, Ill. Additionally, controller 40 preferably has a selectable internal clock rate such that the clock rate of controller 40, and thus the computing speed and power consumption, can be selected through suitable commands sent to device 16 over loop 14. Since higher clock speeds will cause controller 40 to draw more power, clock selection of controller 40, and selection of the voltage level provided by power module 38 to controller 40 are preferably performed in tandem. In this manner the processing speed and power consumption of device 16 are selectable and vary together.

Controller 40 is coupled to the various channels through interface bus 54, which is preferably a serial bus designed for high speed data communication such as a Synchronous Peripheral Interface (SPI). Channels 42, 44, 46 and 48 are coupled to bus 54 through communication isolators 56, 58, 60 and 62, respectively, which are preferably known optoisolators, but which can be any suitable isolation devices such as transformers or capacitors. In some embodiments, channels 42, 44, 46 and 48 provide data in parallel form, and parallel-serial converters 64 are used to translate the data between serial and parallel forms. Preferably, converters 64 are Universal Asynchronous Receiver/Transmitters (UART's).

Channel 42 is coupled to controller 40, and includes sensor terminals 1-n, multiplexer (MUX) 66, analog-to-digital (A/D) converter 68, communication isolator 56, and power isolator 70. It is contemplated that communication isolator 56 and power isolator 70 can be combined in a single circuit. Channel 42 is specifically adapted to measure a specific sensor type such as thermocouples, resistance temperature devices, strain gauges, pressure sensors, or other sensor type. Each sensor terminal is adapted to couple a single sensor, such as a thermocouple, to multiplexer 66. Multiplexer 66 selectively couples one of the sensors to A/D converter 68 such that a characteristic of the sensor (voltage for a thermocouple) is measured and communicated to controller 40 through isolator 56 and UART 64. Power for channel 42 is received from power module 38 through power isolator 70. Power isolator 70 is preferably a transformer, but can be any suitable device. Those skilled in the art will appreciate that communication isolator 56 and power isolator 70 cooperate to ensure that channel 42 is electrically isolated from the rest of device 16.

Channel 44 is similar to channel 42, and like components are numbered similarly. Channel 44 can be configured to measure sensors of a different type than that of channel 42. For example, in one embodiment, channel 42 is configured to measure the voltage of thermocouples, and channel 44 is configured to measure the resistance of RTD's. Each sensor terminal in channel 44 is thus configured to couple to an RTD in a two, three, or four-wire (Kelvin) connection. Because channels 42 and 44 are each electrically isolated from the rest of device 16, coupling a first independently grounded sensor to channel 42, and a second independently grounded sensor to channel 44 does not result in the generation of undesirable ground loop errors. Additionally, since each channel can be configured for a specific type of sensor, which can be optimized for a specific application, parameters such as A/D precision and conversion rate can be tailored for the specific sensor type. For example, a channel designed for high-precision may employ an A/D converter of configured to provide a very high accuracy having a relatively slower conversion time. Conversely, a channel designed for sensors that measure a process variable that can changes quickly can employ a lower precision high speed A/D converter. Essentially, any sensor input can be switched between operation with resistance-type sensors to operation with voltage-type sensors based upon configuration information received from controller 40. Controller 40 can provide the configuration information based upon information received over loop 14, or through a local input (not shown). Additionally, controller 40 can provide configuration information to the channels to adjust analog-to-digital sampling rates for each channel, or even for each sensor. This is particularly advantageous where sensor rates of change are anticipated based upon information known about the process.

Channel 46 is similar to channels 42 and 44, however since channel 46 is configured to receive digital inputs, it does not include an analog-to-digital converter. As illustrated, inputs 1-n are coupled to multiplexer 66 which conveys the signal of a selected input to bus 54 through communication isolator 60 and UART 64. In some digital input embodiments, the input level may be such that the digital inputs could be provided directly to UART 64 through isolator 60. Digital inputs are generally indicative of logic-type signals such as contact closure in limit switches as the like. However, digital inputs 1-n can also be coupled to digital outputs of other process devices such that the inputs represent logic signals such as alarms or other Boolean type signals.

Channel 48 is similar to channel 46, but essentially operates in reverse compared to channel 46. Thus, serial information sent to channel 48 through the UART is converted into parallel form, and conveyed across communication isolator 62 to set individual actuator outputs. Thus, logic signals are sent to the terminals labeled ACTUATOR 1-n to cause actuators coupled to such terminals (not shown) to engage or disengage as desired. Such actuators can be any suitable device such as valve controllers, heaters, motor controllers and any other suitable device. Essentially, any device that is addressable based upon a logic type output is an actuator.

Figure 3:
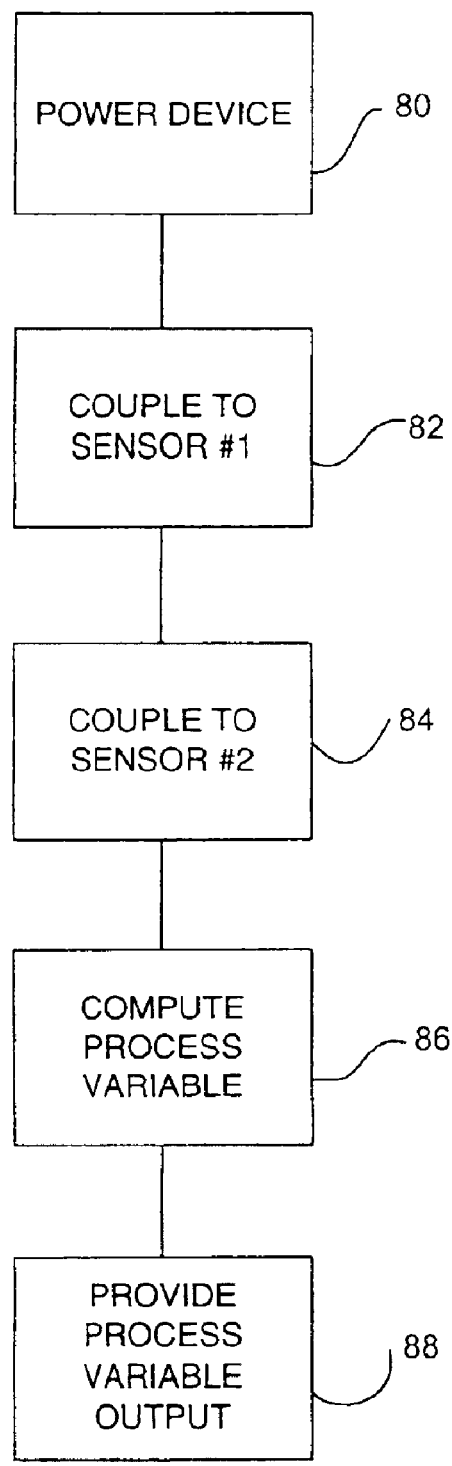
FIG. 3 is a system block diagram of a method of providing a process variable with a field-mounted process device in accordance with an embodiment of the present invention.

FIG. 3 is a system block diagram of a method of providing a process variable with a field-mounted process device in accordance with an embodiment of the present invention. The method begins at block 80 where a field-mountable process device is wholly powered by a two-wire process control loop. At block 82, the process device is coupled to a first sensor through a first isolated input channel. A sensor signal is acquired through the first isolated input channel, which signal is indicative of a process variable. At block 84, the process device is coupled to a second sensor through a second isolated input channel in order to acquire a second sensor signal. Since the first and second input channels are isolated, independent grounding of the first and second sensors will not cause undesirable ground loop errors. At block 86, the process device computes a process variable based upon one or both of the sensor signals. Moreover, although the method is described with respect to two sensors, a number of additional sensors could be used such that the process variable would be a function of any number of sensor signals. For example, the process device could average the values of the sensor, provide their difference, standard deviation, or any other appropriate function. At block 88, the computed process device is output. Such output can be in the form of information sent over the process control loop, a local display, or a local output effected through an output channel.

Figure 4:
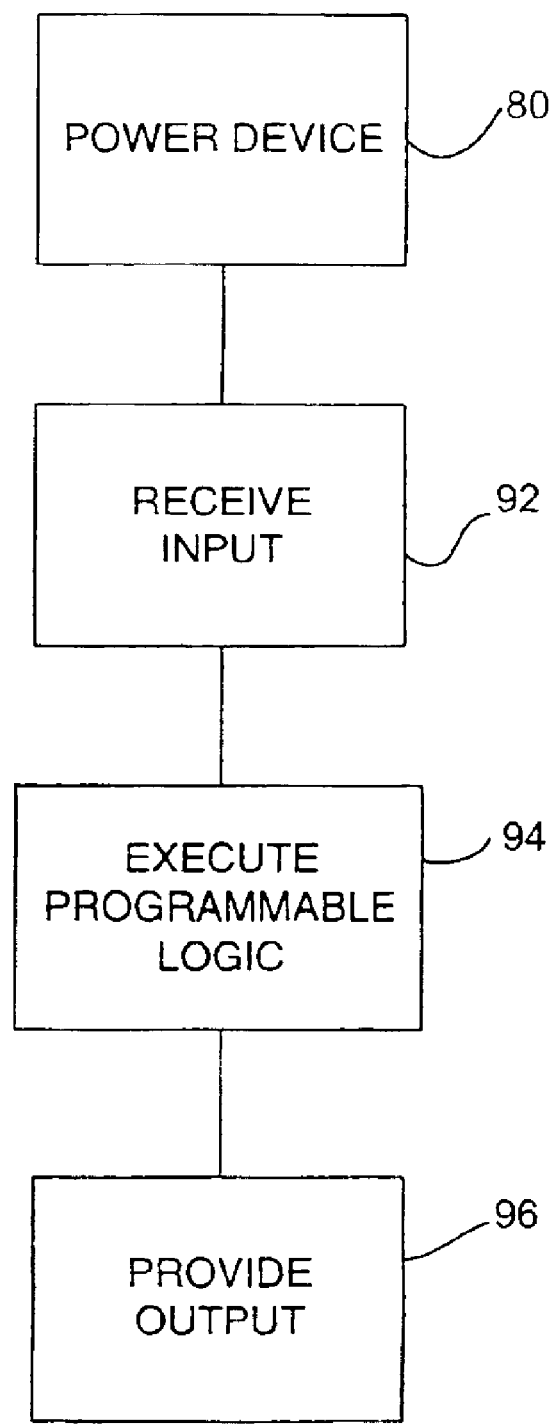
FIG. 4 is a system block diagram of a method of operating a field-mounted process device in accordance with an embodiment of the present invention.

FIG. 4 is a system block diagram of a method of operating a field-mounted process device in accordance with an embodiment of the present invention. At block 80, the device is wholly powered by the two-wire process control loop. At block 92, the device receives an input. Such input can be in the form of signals received through input channels, such as the multiple isolated input channels described above, in the form of process information received through the two-wire process control loop, in the form of a local input, or any combination of input signals and information. At block 94, the device executes user-programmable logic to relate the input information to one or more process outputs. The user-programmable logic can be simple or complex algorithms such as ladder logic, SFC's, fuzzy logic, Adaptive Control, or neural networks and the like. At block 96, the device provides the output determined via operation of the user-programmable logic. The output can be a local output, either digital or analog, or the output can be sent as information over the two-wire process control loop.

Although the present invention has been described with reference to embodiments of two-wire process device having four channels, workers skilled in the art will recognize that changes may be made in form and detail without departing from the spirit and scope of the invention, which are defined by the appended claims. For example, although various modules have been illustrated and described separately, it is expressly contemplated that some such modules can be physically embodied together, such as on an Application Specific Integrated Circuit. Further, although controller 40 is described as a single module, its functions can be distributed upon multiple microprocessors such that one microprocessor could provide low-level I/O interaction, such as calibration, linearization and the like, while a second microprocessor executes the user-generated control algorithm. Additionally, although the description has focussed upon inputs and outputs being provided through the disclosed channels, it is expressly contemplated that some process inputs or process outputs could be communicated from/to other process devices through the process control loop.

What is claimed is:

1. A two-wire field-mountable process device comprising:
    a power module couplable to a two-wire loop and adapted to wholly power the process device with power received from the two-wire loop;
    a loop communicator coupled to the power module, and being couplable to the two-wire loop to communicate on the two-wire loop in accordance with the Fieldbus or Profibus protocol, wherein the communicator is configured to provide an output on the loop;
    a controller coupled to the loop communicator and power module;
    a first channel operably coupled to the controller, the first channel configured to couple to at least a first sensor and configured to receive a sensor input;
    a second channel operably coupled to the controller, the second channel configured to couple to a second sensor and receive a sensor input; and
    wherein the first and second channels are substantially electrically isolated from each other and from the two-wire loop.

2. The process device of claim 1 wherein the first sensor is of a first type, the second sensor is of a second type, and wherein the first and second types are different.

3. The process device 2 wherein the first type is selected from the group of sensors consisting of thermocouples and RTDs.

4. The process device of claim 1 and further comprising:
    a first analog-to-digital converter operably coupled to the first channel and to the controller, the first converter being adapted to convert an analog signal from the first channel, into at least one digital value at a first conversion rate, and to convey the digital signal to the controller; and
    a second analog-to-digital converter operably coupled to the second channel and to the controller, the second converter being adapted to convert an analog signal from the second channel, into at least one digital value at a second conversion rate, and to convey the digital signal to the controller; and
    wherein the first and second conversion rates are different.

5. The process device of claim 4 wherein the first conversion rate is related to a type of sensor to be coupled to the first sensor terminals.

6. The process device of claim 5 wherein the second conversion rate is related to a type of sensor to be coupled to the second sensor terminals.

7. The process device of claim 1 and further comprising:
    a multiplexer coupled to the first channel; and
    an analog-to-digital converter operably coupled to the first channel via the multiplexer, the analog-to-digital converter being operably coupled to the controller, wherein the analog-to-digital converter is adapted to convert an analog signal from the first sensor terminals, into at least one digital value and to convey the digital signal to the controller.

8. The process device of claim 1 wherein the controller operates in accordance with a program.

9. The process device of claim 8 wherein the program can be changed.

10. The process device of claim 9 wherein the program can be changed by accessing the device through the two-wire loop.

11. The process device of claim 8 wherein the program relates an input to the output.

12. The process device of claim 1 wherein the controller computes a process variable based upon a sensor input.

13. The process device of claim 1 wherein the process device is in accordance with a DIN standard.

14. The process device of claim 1 wherein the process device complies with an intrinsic safety specification.

15. The process device of claim 1 including third sensor input operably coupled to the controller, the third sensor input configured to couple to a third sensor and configured to receive a third sensor input.

16. The process device of claim 15 including a multiplexer configured to selectively couple the sensors to the controller.

17. The process device of claim 16 including an analog to digital converter coupled to an output of the multiplexer and to the controller configured to provide a digitized signal to the controller.

18. The process device of claim 1 wherein the loop communicator includes isolation circuitry.

19. The process device of claim 1 including a power module which is configured to power circuitry of the first and second channels.

20. A two-wire field-mountable process device comprising:
a power module couplable to a two-wire loop and adapted to wholly power the process device with power received from the two-wire loop;
a loop communicator coupled to the power module, and being couplable to the two-wire loop to communicate on the two-wire loop;
a controller;
first sensor terminals configured to couple to at least a first sensor and configured to receive a sensor characteristic;
second sensor terminals configured to couple to a second sensor and configured to receive a sensor characteristic the second sensor terminals operably coupled to the controller;
third sensor terminals configured to couple to a third sensor and configured to receive a third sensor characteristic;
a multiplexer configured to selectively couple the first sensor terminals to the controller or the third sensor terminals to the controller;
an analog to digital converter coupled to an output of the multiplexer and to an input of the controller, the analog to digital converter configured to provide a digitized signal to the controller;
wherein an output from the loop communicator on the two-wire process control loop is related to at least one of the first, second or third sensor characteristics; and
wherein at least the first and second sensor terminals are substantially electrically isolated from each other and from the two-wire loop and the second and third sensor terminals are substantially electrically isolated from each other and from the two wire loop.

21. The process device of claim 20 wherein the first sensor is of a first type, the second sensor is of a second type, and wherein the first and second types are different.

22. The process device of claim 20 wherein the first sensor is selected from the group of sensors consisting of thermocouples and RTDs.

23. The process device of claim 20 comprising:
a second analog-to-digital converter operably coupled to the second sensor terminals and to the controller.

24. The process device of claim 20 wherein the controller operates in accordance with a program.

25. The process device of claim 24 wherein the program can be changed.

26. The process device of claim 25 wherein the program can be changed by accessing the device through the two-wire loop.

27. The process device of claim 24 wherein the program relates a sensor characteristic to the output.

28. The process device of claim 24 wherein the controller computes a process variable based upon a sensor characteristic.

29. The process device of claim 20 wherein the process device is in accordance with a DIN standard.

30. The process device of claim 20 wherein the process device complies with an intrinsic safety specification.

31. The process device of claim 20 wherein the loop communicator includes isolation circuitry.

32. The process device of claim 20 including a power module which is configured to power circuitry of the first sensor terminals, circuitry of the second sensor terminals, and circuitry of the third sensor terminals.

33. The process device of claim 20 wherein including a first channel which includes the first and third sensor terminals.

34. The process device of claim 33 including a second channel which includes the second sensor terminals.

35. A two-wire field-mountable process device comprising:
a power module couplable to a two-wire loop and adapted to wholly power the process device with power received from the two-wire loop;
a loop communicator coupled to the power module, and being couplable to the two-wire loop to communicate on the two-wire loop;
a controller coupled to the loop communicator and power module;
a first channel operably coupled to the controller, the first channel configured to couple to at least a first sensor;
a second channel operably coupled to the controller, the second channel configured to couple to a second sensor;
wherein the first and second sensor channels are substantially electrically isolated from each other; and
wherein circuitry of the first channel and circuitry of the second channel are powered by the power module.

36. The process device of claim 35 including a connection to a third sensor.

37. The process device of claim 36 including a multiplexer configured to selectively couple the first sensor to the controller or the third sensor to the controller.

38. The process device of claim 37 including an analog to digital converter coupled to an output of the multiplexer and to the controller configured to provide a digitized signal to the controller.

39. The process device of claim 36 wherein the power module is configured to power circuitry of the connection to the sensor.

40. The process device of claim 35 wherein the power module simultaneously powers the circuitry of the first channel and circuitry of the second channel.

* * * * *